United States Patent [19]

Berger et al.

[11] 4,158,783
[45] Jun. 19, 1979

[54] CURRENT HOGGING INJECTION LOGIC WITH SELF-ALIGNED OUTPUT TRANSISTORS

[75] Inventors: Horst H. Berger, Sindelfingen; Siegfried Wiedmann, Stuttgart, both of Fed. Rep. of Germany

[73] Assignee: International Business Machines Corporation, Armonk, N.Y.

[21] Appl. No.: 823,314

[22] Filed: Aug. 10, 1977

[30] Foreign Application Priority Data

Nov. 16, 1976 [DE] Fed. Rep. of Germany ....... 2652103

[51] Int. Cl.² ...................... H01L 27/04; H03K 19/08
[52] U.S. Cl. ...................... 307/213; 148/1.5; 148/187; 357/20; 357/44; 357/46; 357/89; 357/92; 357/35; 357/36; 357/91; 357/50; 307/215
[58] Field of Search ...................... 357/34, 35, 36, 44, 357/46, 92, 20; 307/213

[56] References Cited

U.S. PATENT DOCUMENTS

| | | | |
|---|---|---|---|
| 3,919,005 | 11/1975 | Schinella et al. | 357/50 |
| 3,959,809 | 5/1976 | Allison | 357/20 |
| 3,993,513 | 11/1976 | O'Brien | 357/92 |
| 4,056,810 | 11/1977 | Hart et al. | 357/92 |
| 4,058,419 | 11/1977 | Tokamara et al. | 357/92 |

FOREIGN PATENT DOCUMENTS

| | | | |
|---|---|---|---|
| 2446649 | 4/1976 | Fed. Rep. of Germany | 357/92 |
| 1398862 | 6/1975 | United Kingdom | 357/92 |

OTHER PUBLICATIONS

Muller, IEEE Journal of Solid State Circuits, vol. SC-10, No. 5, Oct. 1975, pp. 348–352.
Hart et al., Electronics, Oct. 3, 1974, pp. 111–118.
Lehning, IEEE J. of Solid State Circuits, Oct. 1974, pp. 228–233.

*Primary Examiner*—William D. Larkins
*Attorney, Agent, or Firm*—Wesley DeBruin

[57] ABSTRACT

Improved integrated bipolar semiconductor structures and a method of fabricating same are disclosed. The logic circuit structures disclosed have enhanced density and speed power product. The teaching of the disclosed logic circuit structures includes utilization and extension of the known concepts of Current Hogging Injection Logic (CHIL) and Integrated Injection Logic (I²L). The disclosed method of fabrication includes a minimum number of process steps, where each step is well within the state of the art and does not contain critical alignment problems.

9 Claims, 21 Drawing Figures

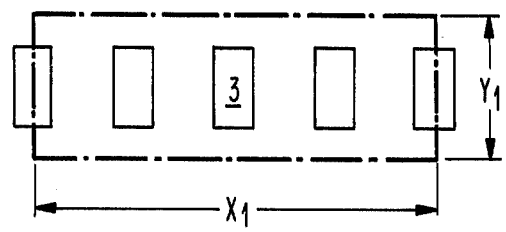
FIG. 3A
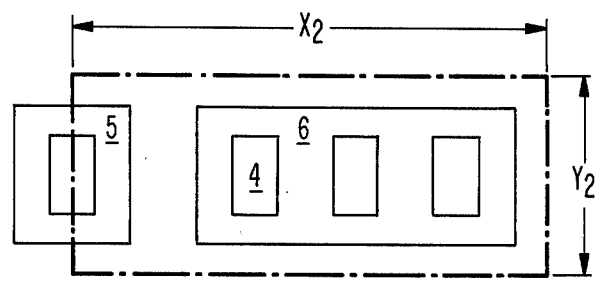
MTL
FIG. 3B
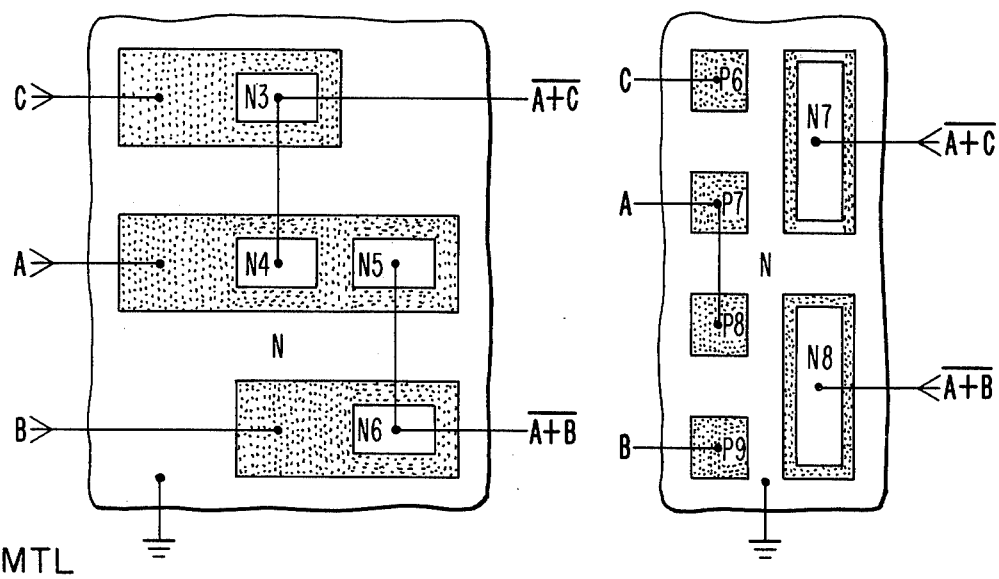
MTL
FIG. 4A
FIG. 4B

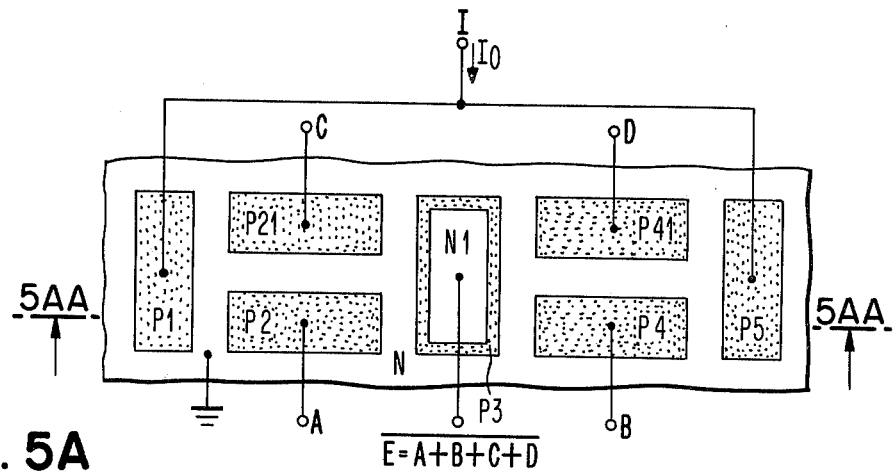
FIG. 5A
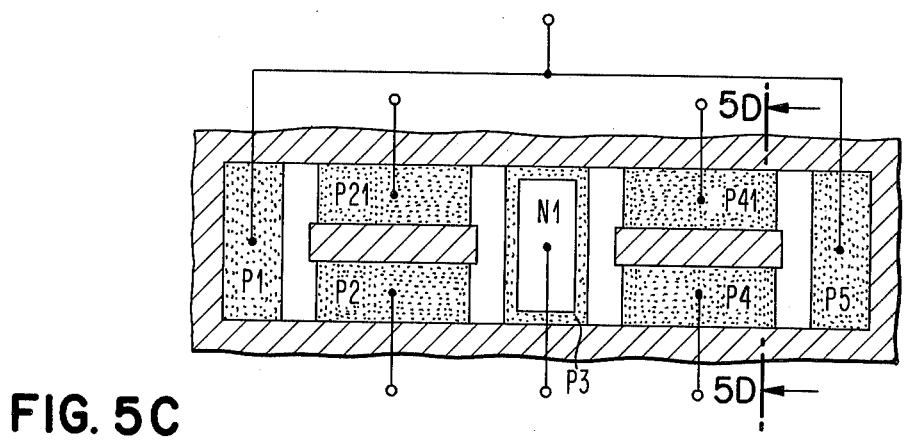
FIG. 5C
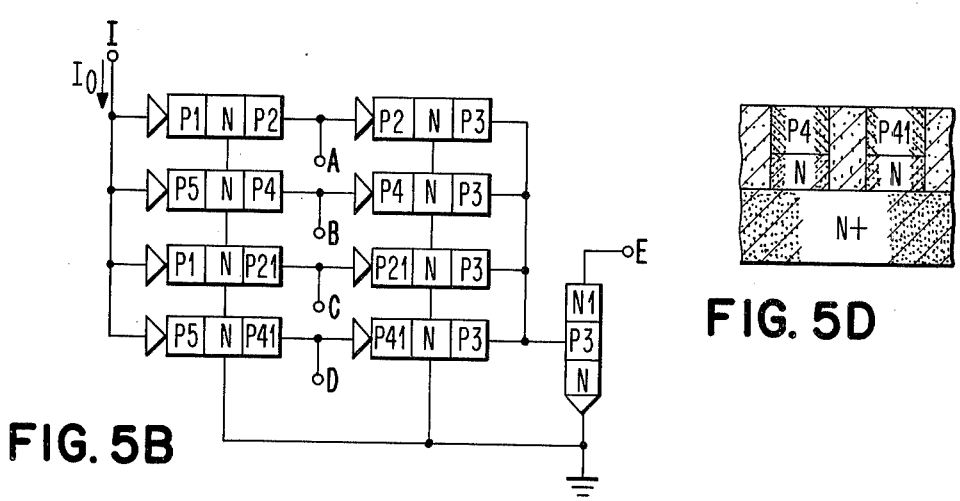
FIG. 5B
FIG. 5D

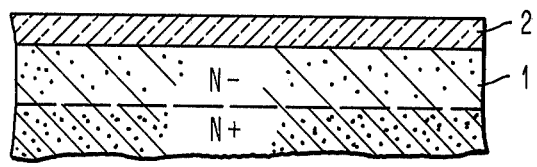
FIG. 8A
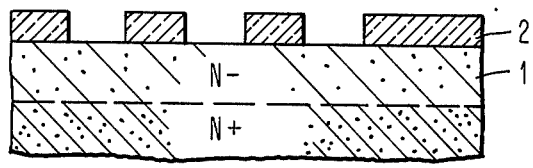
FIG. 8B
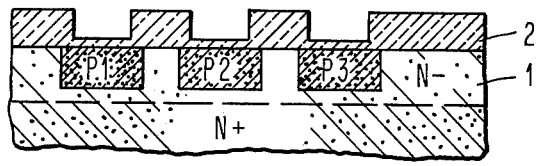
FIG. 8C
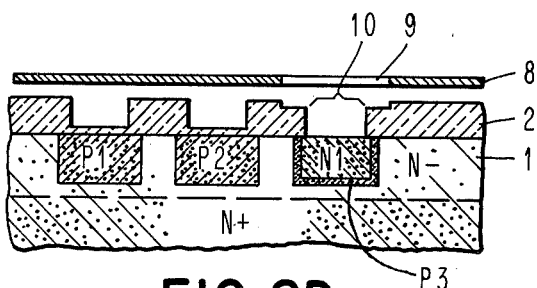
FIG. 8D
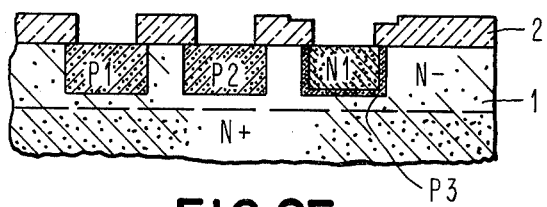
FIG. 8E
FIG. 8

CURRENT HOGGING INJECTION LOGIC WITH SELF-ALIGNED OUTPUT TRANSISTORS

Cross-Reference Patents of HORST H. BERGER and SIEGFRIED K. WIEDMAN, all of common assignee with the instant application U.S. Pat. No. 3,736,477, entitled "Monolithic Semiconductor Circuit for a Logic Circuit Concept of High Packing Density", granted May 29, 1973 to Horst H. Berger and Siegfried K. Wiedmann.

U.S. Pat. No. 3,816,758, entitled "Digital Logic Circuit" granted June 11, 1974 to Horst H. Berger and Siegfried K. Wiedmann.

U.S. Pat. No. 3,823,353, entitled "Multi-Layered Vertical Transistor Having Reach-Through Isolating Contacts" granted July 9, 1974 to Horst H. Berger and Siegfried K. Wiedmann.

U.S. Pat. No. 3,916,218, entitled "Monolithically Integrated Binary Logic Circuit", granted Oct. 28, 1975 to Horst H. Berger and Siegfried K. Wiedmann.

U.S. Pat. No. 3,956,641, entitled "Complementary Transistor Circuit For Carrying Out Boolean Functions" granted May 11, 1976 to Horst H. Berger and Siegfried K. Wiedmann.

Pending U.S. Pat. No. 4,035,664 entitled "Current Hogging Injection Logic", granted July 12, 1977 to Horst H. Berger and Siegfried K. Wiedmann.

BACKGROUND OF THE INVENTION AND PRIOR ART

In the field of integrated circuit technology, the invention of the circuit concept known as MTL (Merged Transistor Logic) or I$^2$L (Integrated Injection Logic) has to a large extent provided the advantages of traditional bipolar techniques (high switching speed) combined with the advantages of Field Effect Transistor techniques (high integration density, low power dissipation). Of the number of articles published on I$^2$L in the trade literature reference is made to the following: (1) "Merged-Transistor Logic (MTL)—A Low-Cost Bipolar Logic Concept" by Horst H. Berger and Siegfried K. Wiedmann, IEEE Journal of Solid-State Circuits, Vol. SC-7, No. 5, October 1972 pages 340 through 346, and (2) "Injection Integrated Logic: A New Approach to LSI", by Kees Hart and Arie Slob, Vol. SC-7, No. 5, October 1972, pages 346 through 351.

Subsequently, developments based on the above (injection) concept have become known under various designations. In these developments, the carrier current emanating from a (primary) injector on its way to a collecting area may be switched in a condition-dependent manner via various control regions arranged in the path. In other words, the so-called secondary injection in PNP chains is utilized for the forming of logic combinations.

Reference is made to the following publications:

"Current Hogging Injection Logic: New Functionally Integrated Circuits" by Rudiger Muller (ISSCC 75/Friday, Feb. 14, 1975/Brandywine Ballroom/9:00–12:00) Digest of Technical Papers, 1975 IEEE International Solid-State Circuits Conference, pages 174, 175;

"Current Hogging Injection Logic—A New Logic with High Functional Density" by Rudiger Muller, IEEE Journal of Solid-State Circuits, Vol. SC-10, No. 5, October 1975, pages 348 through 352; and "Current Hogging Logic (CHL)—A New Bipolar Logic for LSI" by Heinz Lehning, IEEE Journal of Solid State Circuits, October 1974, pages 228 through 233.

Reference is also made to U.S. Pat. No. 4,035,664 entitled "Current Hogging Injection Logic" granted July 12, 1977 to Horst H. Berger and Siegfried K. Wiedmann.

In the fabrication of known designs of logic circuit structures, based on the injection principle, where logic functions of input variables are to be executed, at least three dimension-determining masks (including the contact holes without metallization pattern) are required. If processing starts, for example, with an N-doped semiconductor material a first mask is required for generating the P-doped conductive areas of the PNP structures. By means of a second mask, the N-doped conductive areas within certain P-areas for the NPN structures are defined. Finally, a third mask is required for providing the contact holes to the respectively doped areas. The subsequent known manufacturing process steps are not of interest for the purposes of this explanation. Hence, it is deemed unnecessary to recite same.

The invention provides improvements in Current Hogging Injection Logic circuits and an improved method of fabricating same. The method of fabrication provides for the straight forward relatively easy and non-critical production of said improved circuits, with fewer masks. Further, semiconductor logic circuit structures, in accordance with the invention provide increased integration density and improved power-delay product per logic function. Thus, from an economic point of view, a major advantage of the invention is a further decrease of the manufacturing costs of such circuits in that the function density in a predetermined packing density is increased, or in that a maximum of circuit functions are housed on one entire semiconductor substrate (chip).

Briefly, the invention, in its more generalized form for the direct realization of logic combinations of input variables provides that, in a semiconductor arrangement with at least two doping areas placed one within the other, of which at least the outer one is to be electrically accessible, a surface contact is provided not in that area directly but in an adjacent area of the same conductivity. The functional coupling to the outer one of the at least two doping areas placed one within the other takes place via injection coupling. For an NPN transistor structure this means, by way of example, that the base contact area is separated from the intrinsic base and arranged before it. The connection is made through hole injection. Due to the contact area separation a much simpler manufacturing process may be used for circuits of this type. This is because the doped areas and if necessary, even the contact openings are jointly definable as minimum surfaces through one single mask, with only a relatively uncritical rough mask (so-called block-out mask) being added thereto.

In the prior art a semiconductor arrangement is known where between an injector area and an NPN output transistor, which has no external base contact, there is another area having an external contact and being of the same conductivity type as the transistor base area. Reference is made to "Bipolar LSI Takes A New Direction with Integrated Injection Logic" by C. M. Hart, A. Slob and H. E. J. Wulms, Electronics of Oct. 3, 1974, pages 111 through 118, (page 114). However, the semiconductor arrangement shown there explicitly serves for the voltage level adaptation required at the interface of different circuit concepts, namely I²L/TTL. There is no teaching or suggestion whatever regarding the execution of logic combinations. The publication is devoid of a teaching or suggestion of the advantageous and efficient manufacturing and masking steps of the process of the present invention. In particular, the output of the level adapter circuit is not the original logic output where the logic result is generated for the first time. Indeed, the respective logic operation is executed in the preceding conventional I²L circuit portion and is available at the input of the level adapter circuit.

As to the forming of two doped areas through a single mask opening, reference is made to GE-OS No. 1,789,055. More specifically, GE-OS No. 1,789,055 discloses twice diffusing through the same oxide window to provide PN capacitors.

The foregoing and other objects, features and advantages of the invention will be apparent from the following more particular description of the preferred embodiments as illustrated in the accompanying drawings.

DESCRIPTION OF THE DRAWINGS

The drawings show the following:

FIGS. 3A and 3B disclose planar representations for the area comparison of an arrangement in accordance with the invention (FIG. 3A) with a comparable known MTL structure (FIG. 3B).

FIGS. 4A and 4B disclose planar representations depicting the logic interchangeability of arrangements in accordance with the invention and known MTL, or I²L comparison arrangements.

FIG. 5A discloses a planar view of a further semiconductor structure in accordance with the invention in the form of a NOR gate extended to four inputs;

FIG. 5B discloses a circuit diagram of the structure of FIG. 5A;

FIG. 5C is a further planar structure of the view of FIG. 5A expressly depicting suitable isolation regions; and FIG. 5D is a cross-sectional view of the structure of FIG. 5C taken along the line 5D-5D.

FIG. 8 includes FIGS. 8A through 8E.

FIGS. 8A through 8E depict successive cross-sectional views of a semiconductor structural embodiment at successive stages in the manufacturing process, or steps in the method, in accordance with the invention.

In the disclosed embodiments, the plan views and cross-section views, are respectively set forth for explanation purposes. It is to be appreciated that the representation of the respective arrangement of the doped areas, as well as the other dimensions are generally not in scale but have intentionally been presented out of scale for better understanding. Similarly, the electrical connections have been presented schematically only. In plan views, which show the position of the doped areas, the insulating layer covering the semiconductor body is assumed to be transparent.

Figure 1A:
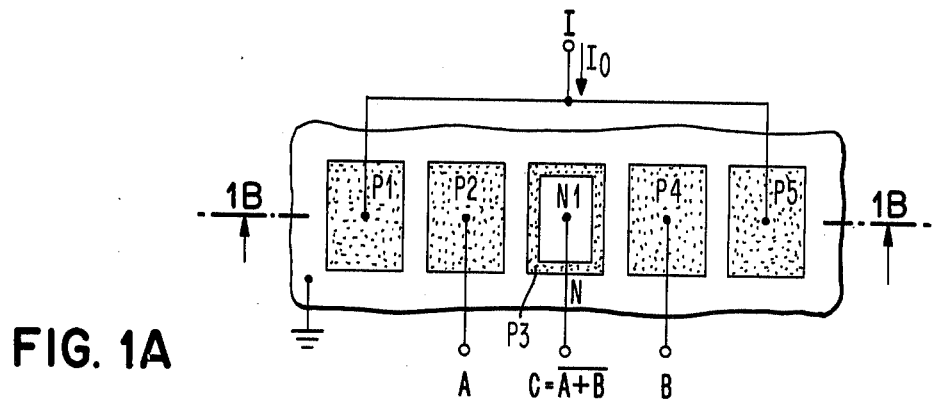
FIG. 1A is a plan view of a first embodiment of the invention in the form of a NOR gate for two input variables.
Figure 1B:
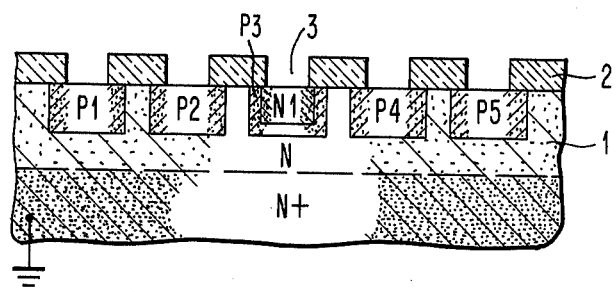
FIG. 1B is a cross-sectional view through the line 1B—1B of the semiconductor structure of FIG. 1A.

FIGS. 1A and 1B show, in a plan view and an associated cross-section along the given sectional line, a first embodiment of a semiconductor arrangement in accordance with the invention. As will be explained below, this embodiment represents a NOR gate for two input variables A and B. The structure for the NOR gate is provided by a semiconductor body 1 which comprises, for example, N-conductivity type silicon. The semiconductor body preferably has, as shown, in a manner known per se, a buried N+-region with an N-conductivity type epitaxial layer provided thereover. The surface of the semiconductor body 1, has P-type areas, or regions, P1 to P5, spaced in a manner that is typical for the above discussed injection logic. These P-type areas are preferably provided through openings, or windows, in insulation layer 2 which covers semiconductor body 1. Insulating layer 2 is preferably silicon dioxide. Using well-known photolithographic processes with subsequent diffusion, or ion-implantation processes, respectively, the regions P1 through P5 are provided. Outer doped areas P1 and P5 are the so-called primary injectors for the current supply. They are electrically interconnected and accessible via outer injector contact I. Via this injector contact I a (selectable) current flow $I_0$ is impressed in the manner generally applied for such logic injection concepts. P2 and P4 are the so-called secondary injection areas having logic inputs A and B, respectively. In the following more detailed description, they will also be called base control or base contact areas. By means thereof the carrier current from primary injectors P1 and P5 can be switched in a condition-dependent manner on its way to the output transistor arranged in the middle of this PNP chain arrangement. The output transistor comprises the P3 area contained within the N-semiconductor body 1, and the N1-area contained within the P3 area. The N1-doped area supplies an output C where the NOR combination of input variables A and B is available.

With respect to its electrical function, the semiconductor arrangement, or structure, described may be viewed as a highly integrated assembly of different PNP transistors, e.g., the lateral PNP transistors with the zone sequence P1-N-P2, P2-N-P3, etc., with a (vertical) NPN transistor of the zone sequence N-P3-N1. As in injection logic, in general, in accordance with the afore-referenced prior art, the output transistor is an inversely operated transistor, i.e., the N1-doped area operates as a collector, the P3 area as the base, and the basic N-semiconductor body 1 including the buried N+ region as the emitter.

One specific feature and advantage of the present invention is that the output transistor (N-P3-N1) contrary to known prior art logic circuits of the injection type, does not require an external base contact to its P3 base area. As the NPN output transistor does not require any external base contact whatever, it is possible to provide there both the P3 base area and the N1 collector area (corresponding in a normally operated transistor to the emitter area). Thus, through one and the same mask window 3 in insulation layer 2 (FIG. 1B), the regions P3 and N1 may be provided in the order recited. Additionally, this same window 3 is advantageously utilized as the contact opening for external contact C to the N1 area. In the same manner, the respective openings for P1, P2, P4 and P5, in layer 2, coincide with P-regions and with the contact openings. Consequently, the entire structure including the contact holes can be defined on one single mask, contrary to the known circuits of this type. Merely for distinguishing the position of the collector (N1) of the NPN output transistor a rough mask (so-called blockout mask) is required, which, with respect to its dimensions is not critical. Thus, a highly simple and inexpensive manufacturing process and method can be utilized. This process and method will be referred to and more fully explained hereinafter. Furthermore, owing to the saving of masking steps, the structure can be made very small in its horizontal extension (as viewed in FIGS. 1A and 1B) because on principle each opening can have minimum dimensions. The dimensional increases, which are otherwise required in consideration of overlapping tolerances, are not required with respect to the minimum size of the mask openings. Finally, a higher current amplification value $\beta$ and a higher switching speed are possible due to minimum dimensioned structures.

The theoretical operative interrelation forming the basis of the function of the NOR gate described, is similar to those of known injection circuits of the type as described in U.S. Pat. No. 4,035,664 entitled "Current Hogging Injection Logic". In the present application, therefore, only a short summarized, but complete, explanation of the function is deemed to be sufficient. Via injector contact I a current $I_0$ is impressed on the two primary injectors P1 and P5. The primary injectors inject carriers, for the selected conductivity types, holes (defect electrons), which (also) reach the respective adjacent P2 and P4 doped areas. Depending on the potentials applied at these areas (P2, P4), said potentials, in turn, having the two binary definitions (A, B) associated thereto, the carriers collected from these areas (P2, P4) are drained off via the input contacts (A, B) and the output transistors of adjacent logic gates (not shown) whose transistors are respectively connected thereto in a larger logic circuit. Alternatively, the carriers from the primary injectors can charge the P2 and/or P4 region in the respective other binary state of the input variables A and B to such an extent that from these areas there further emanates a secondary injection in the direction of the (common) output transistor (N1, P3, N). Its P3 base area acts as a collector for these carriers from the secondary injectors. The current flow thus produced, or not produced, through the output transistor structure is consequently determined by inputs A and B. It is obvious that there is a current flow through the output transistor (N1, P3, N) when at least one of areas P2 or P4, connected to inputs A or B, acts as a secondary injector. With respect to the base of the output transistor (P3) there is, therefore, an OR combination to the potentials at A and B, which for the collector potential is inverted into a NOR combination.

Regarding the correlation of the binary states "0" and "1" to the respective voltages or potentials the present description is based on positive logic. The respective potentials are the usual MTL or I²L potentials. The binary state "1" corresponds to the value of the forward voltage of the respective PN interface, e.g., the interface between the P2 area and the surrounding N-semiconductor body, which for silicon interfaces corresponds to a potential of approximately 0.7 V. On the other hand, the binary status "0" corresponds in positive logic to the value of the (transistor) saturation voltage, i.e., essentially 0 V. The invention is not restricted to this correlation.

Figure 2A:
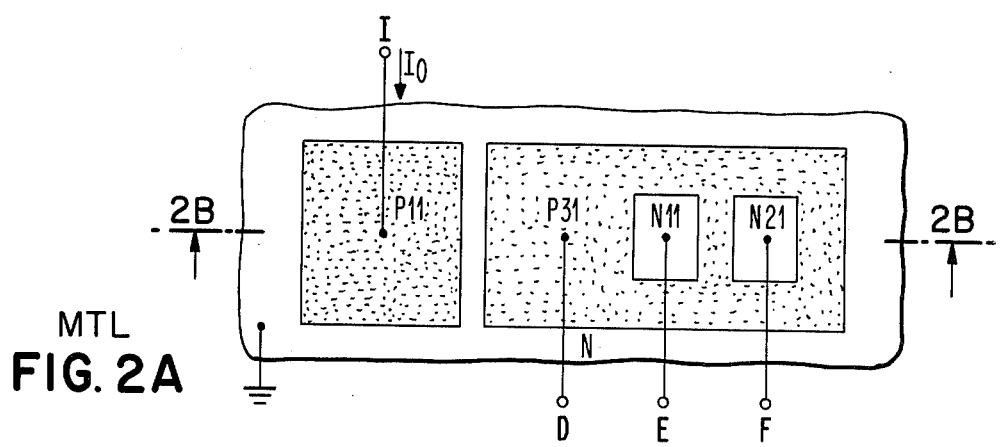
FIG. 2A is a planar view of a known (MTL) I²L semiconductor structure.
Figure 2B:
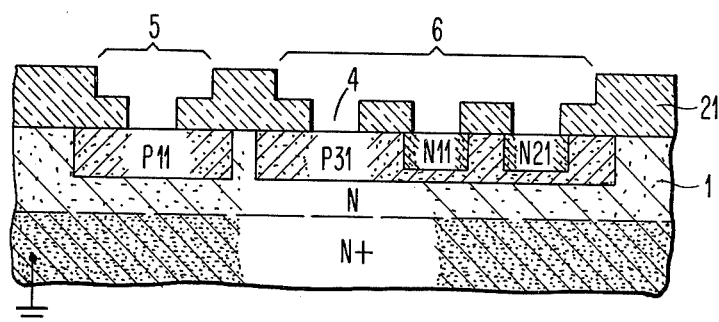
FIG. 2B is a cross-sectional view along the line 2B—2B of the structure of FIG. 2A.

For a complete and clear illustration of the background of the invention, FIGS. 2A and 2B, respectively show a plan view and an associated cross-sectioned view of an MTL/I²L basic structure. The structure of FIGS. 2A and 2B are, per se, known to the prior art. This structure shows an input D and two outputs E and F. As will be explained below in detail with reference to FIG. 4, multiple collectors (outputs) in MTL/I²L, may be viewed as corresponding to multiple secondary injectors in structures in accordance with the embodiments of the invention. Referring to FIG. 2A, a primary injection area P11 having an injector contact I is provided in an N-conductive semiconductor body 1. Still referring to FIG. 2A, adjacent the P11 area is a base area P31 of the output transistor. The P31 area corresponds to the P3 area in FIG. 1A. In FIG. 2A, a secondary injector corresponding to the P2 area in FIG. 1A is not provided. The P31 base zone of the output transistor of FIG. 2A contains two spaced apart areas N11 and N21 (collector areas). In the left-hand portion of the P31 base area, as viewed in FIG. 2A, space is provided for the external (condition) contact D and for the associated contact hole 4, FIG. 2A. The semiconductor arrangement is covered with an insulation layer 21.

Compared with the known basic structure of FIGS. 2A and 2B, the features and advantages of the invention will be emphasized and their importance appreciated. The semiconductor structures fabricated in accordance with the invention do not show or require an external base contact for the output transistor, nor any multiple collectors or outputs, respectively. The manufacturing process, in accordance with the invention, described above, and also further described in detail hereinafter is quite simple, and essentially requires only one dimension-determining mask, whereas structures of the prior art type (FIGS. 2A, 2B) require a much more complex process and result in semiconductor circuits having a lower density of integration.

For fabricating the structure shown in FIGS. 2A, 2B the openings 5 and 6 are made in the (thick) insulation layer down to the surface of semiconductor body 1 by means of a first masking step. Through these openings the P11 as well as the P31 area are provided (e.g., by means of diffusion). Subsequently, as insulation layer is again formed in these openings so that the semiconductor body is covered with a continuous (stepped) protective layer. By means of a second masking step windows are opened in the last insulation layer for inserting the doping substances for collector areas N11 and N21. By means of a third masking step the contact openings are made, in particular, contact opening 4 for the base contact. Due to the successive masking steps and the tolerance increases required for aligning the masks the respective arrangements involved clearly require more semiconductor surface than those of the invention.

In FIGS. 3A, 3B an area comparison, true to scale, is made of the embodiment of the invention (FIGS. 1A, 1B) with the known prior art structure (FIGS. 2A, 2B). FIG. 3A shows a section of the (only) dimension-determining mask required for the embodiment of the invention of FIGS. 1A, 1B. Namely, FIG. 3A represents the plan view of the (oxide) mask openings in insulation layer 2, which are shown in FIG. 1B in cross-section. Correspondingly, FIG. 3B is a plan view of the masks which are placed one on top of the other and which are required for fabricating the prior art arrangement or structure of FIGS. 2A, 2B. For both cases, the same rules of design are applied, i.e., the same directives for the minimum spacings etc. acceptable. It is also to be appreciated that primary injectors for adjacent logic gates can be jointly provided, which explains, referring to the enclosed broken lines, the fact that framings given in FIGS. 3A and 3B for the resulting areas required enclosing only half of certain mask openings. Under these conditions a ratio of $X_1.Y_1/X_2.Y_2 = 1/1.9$ has been obtained for the minimum amount of surface requirements of the above comparison structures. In addition to the advantage of the applicability of a much simpler, less expensive manufacturing process the integration density is also considerably increased.

Referring to FIGS. 4A and 4B, it will now be demonstrated for another embodiment of the invention (FIG. 4B) that omitting the base contact and the multiple collectors in the output transistor structure does not repesent a restriction with respect to the possible logic combinations as compared with known MTL structures (FIG. 4A). For explaining the logic exchangeability of the multiple collectors in MTL concepts, and the multiple secondary injectors in accordance with the invention, the example of two NOR combinations of A and C, and of A and B, respectively is selected. FIG. 4A depicts an MTL embodiment; FIG. 4B depicts an embodiment in accordance with the invention. In both comparison structures (FIGS. 4A, 4B) the primary injectors are not shown. Although the primary injectors are required in each structure for operability, they need not be explicitly shown for the subject comparison and explanation. The representations show that the number of secondary injectors P6, P7, P8, and P9 in FIG. 4B equals the number of the separate collector areas N3, N4, N5, and N6 in FIG. 4A (MTL). In MTL, there is consequently a physical splitting of the collector into separate part collectors, the number of part collectors corresponding to the so-called fan-out. At the fan-in, i.e., at the input side, there is no separation of semiconductor areas; there, we find a so-called wired fan-in. This is indicated in FIG. 4A by the fanning out of the respective input lines. This is possible because the lines assembled there (C, A, B, FIG. 4A) originate from respectively decoupled outputs of other comparable logic gates (not shown).

In the secondary injection NOR gate, in accordance with the invention (FIG. 4B) the secondary injector (P6-P9) is physically split in accordance with the fan-in. At the output side there is instead a so-called wired fan-out in the form of collector N7 and collector N8, respectively. Both measures, i.e., the input side (fan-in) as well as the output side (fan-out) separation are logically of the same value, as shown by the two representations in FIGS. 4A and 4B. With respect to the generation of the two logic combinations shown in FIG. 4B, (i.e., the NOR combination of the input variables A and C on the one hand, and A and B on the other) reference is made to the embodiment of the invention described hereinabove with reference to FIGS. 1A, 1B. Summarizing, with reference to FIG. 4B, it is pointed out that the upper output transistor with collector area N7 is conductive (collector potential approximately 0V) when at least one of the inputs C, or A, permits secondary injection from the P6 or P7 area to the output transistor. If both inputs C and A are at a potential of approximately 0 Volts, the carriers coming from the primary injector (not shown) and reaching the P6 and the P7 areas are drained off via these input lines. When inputs C and A are each at 0 volts, the output transistor, which includes collector N7 remains non-conductive. Alternatively stated, when inputs C and A are each at 0 volts, the potential at collector N7 manifests the upper level voltage value which corresponds to a binary "1". The same explanation is applicable to the NOR combination of input variables A and B in the lower portion of the integrated circuit structure shown in FIG. 4B. It is to be appreciated that from such NOR combinations a variety of more complex combinations can, in accordance with the invention, be constructed. The foregoing statement also applies to the NAND combinations, in accordance with the invention, hereinafter disclosed and explained in detail.

FIG. 5A shows, as another embodiment of the invention, a NOR gate having four inputs (A, B, C, D). The NOR gate of FIG. 5A may be viewed as derived from the NOR gate of FIG. 1A by splitting the secondary injection areas P2 and P4 of FIG. 1A into areas P2, P21 and P4, P41 of FIG. 5A. Accordingly, a zone sequence comparable with FIG. 1B is obtained for a cross-section along the sectional line 5AA—5AA of FIG. 5A. [A cross-sectional view along the line 5AA—5AA of FIG. 5A is not expressly shown in the drawing]. With regard to the operation and function of the secondary injection areas P2, P21 and P4, P41, respectively arranged in parallel to an output transistor (collector N1) reference is made to the afore-recited description and explanation of the embodiment of the invention of FIG. 4B with the corresponding areas P6, P7.

FIG. 5B shows the electric circuit diagram corresponding to the semiconductor arrangement, or structure, of FIG. 5A. The circuit diagram represents the PNP chains together with the NPN output transistor. It will be noted that the output transistor N1, P3, N does not have an external base contact. The circuit diagram also denotes the interconnection of inputs A to D, and of output E. For facilitating the correlation between the circuit diagram on the one hand, and the semiconductor arrangement or structure on the other, the transistor zones show the same reference characters.

It is further pointed out and to be appreciated that the known advantages of a lateral injection stopper or inhibitor in the form of a dielectric insulation zone (so-called recessed oxide isolation or the like), can be utilized in conjunction with the logic structures in accordance with the invention. The injection stopper preferably restricts the lateral injections to the desired (injecting) edges of the associated doped areas, or the desired directions, respectively, and thus improves the electrical characteristics of structures in accordance with the invention. Referring to the semiconductor structure in accordance with the invention as shown in FIG. 5A, FIG. 5C shows dielectric isolation employed as an injection stopper. The respective oxide isolations are cross-hatched in the drawing. An associated cross-section is shown in FIG. 5D. The cross-sectional view shown in FIG. 5D is taken along line 5D—5D of FIG. 5C.

Figure 6A:
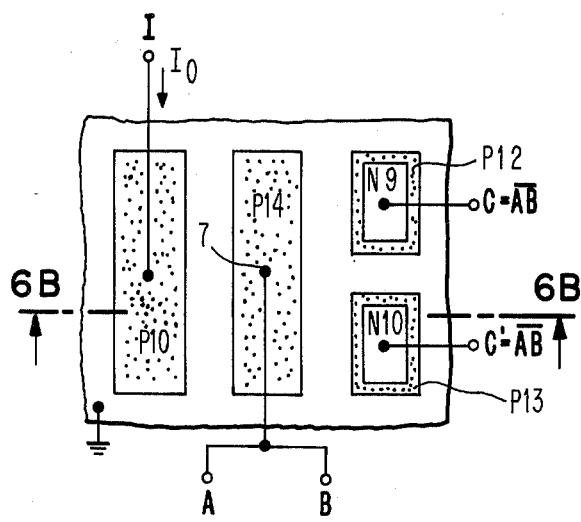
FIG. 6A discloses a planar view of a further semiconductor structure in accordance with the invention in the form of a logic NAND combination gate.
Figure 6B:
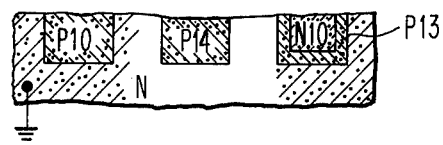
FIG. 6B discloses a cross-sectional view of the structure of FIG. 6A taken along the line 6B–6B.

FIG. 6A shows as another embodiment of the invention, a NAND gate in a schematic plan view. An associated cross-sectional view along the sectional line 6B—6B is represented in FIG. 6A. Here, too, a primary injector P10 with an external injector contact I is provided. The injection current of the primary injector reaches the secondary injection area P14. The P14 area shows a contact 7 which is split electrically into two external input contacts for the input variables A and B. Thus, a so-called wired AND gate is produced at the input. This is possible because signals A and B originate in accordance with this circuit concept from decoupled outputs (comparable with C and C', respectively) from circuitry, not shown. Compared with the arrangement of FIG. 1A, which up to this point is the same as the arrangement described here, the output transistor is, however, divided into two separate transistor structures. Output C is derived from collector area N9 within the one base area P12. Output C' is derived from collector area N10 within the other base area P13. The common emitter area of these output transistors is formed by the N-conductive semiconductor body. This embodiment shows how, in accordance with the invention, by omitting the multiple collectors as well as the base contact for the output transistor, a NAND function can be executed by splitting the condition input into two or more inputs. Also, how by means of the multiple arrangement of output transistors, multiple and mutually decoupled outputs of the same logical function can be obtained. For the expert who designs complex logic circuitry, the freedom of action achieved by this teaching is considerable. This teaching provides to the expert a high flexibility of employing this circuit concept.

Figure 7:
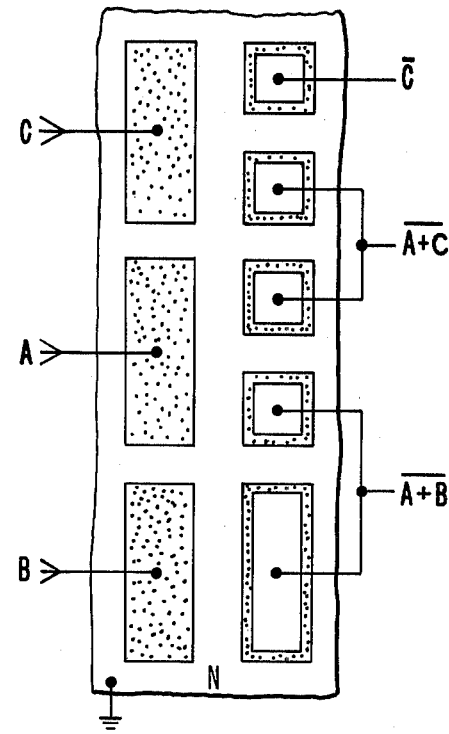
FIG. 7 discloses a planar view of a further semiconductor structure in accordance with the invention, where in response to binary inputs A, B and C the logical outputs $\overline{C}$, $\overline{A+C}$ and $\overline{A+B}$ are provided.

FIG. 7 shows a planar view of a further embodiment of the invention. In FIG. 7, use of a basic arrangement as generally shown in FIG. 6A, is employed. Although no primary injector is expressly shown in FIG. 7, it will be appreciated that a primary injector is required and employed. Referring to the embodiment of the invention depicted in FIG. 7, it is again apparent that structures in accordance with the invention, can be made in a self-aligning manner whereby a fan-out separation is possible when the secondary injector or the base contact area, respectively, is employed with wired fan-in, and when separate collector outputs equalling the number of fan-outs are provided.

Before referring to the simple manufacturing process, in accordance with the invention, which can be utilized for fabricating structures, in accordance with the invention and which is not the least basis of the considerable advantages of practicing the invention, the following brief statements are deemed to be in order. It should be appreciated that a great variety of mixed forms of the basic structures described, each in accordance with the invention, can be employed in a circuit design. By way of example, several parallel and/or serially arranged secondary injection areas can have their effect on a single common output transistor structure. Individual or several of these secondary injection areas can be equipped with split inputs, in accordance with the wired AND combination described. On the other hand, it is possible to provide, together therewith or instead, several output transistor structures common to one secondary injection area. The outputs of said output transistor structures being again split, if necessary, provided decoupled inputs are available. Furthermore, the appearance of the primary injection current in the respective output function can be considered a further condition. It has also been suggested above in connection with injection logic, to provide a varying height of injection current impressed, depending on the required switching speed of the logic gates. This can, of course, also be applied in the present invention. The same is true for the numerous improvements and developments known in the art of injection logic circuits. Reference is made specifically in that connection to the above mentioned and identified U.S. Pat. No. 4,035,644, and the article entitled "The Bipolar LSI Breakthrough, Part 2: Extending the Limits" by applicants, Electronics Oct. 2, 1975, pp. 99–103. According thereto, particularly instead of the lateral injector structures, vertical injectors (cp. p. 101), the design or arrangement of Schottky metal contacts for providing further decoupled input and/or outputs, or as (saturation-preventing) clamp diodes with different barriers, if necessary, are possible.

With reference to the cross-sectional views shown in FIGS. 8A to 8E, a particularly advantageous process in accordance with the invention will be described in detail. The method or process has particular utility in the fabrication of semiconductor structures in accordance with the invention wherein an output transistor without a galvanic base contact is employed. The semiconductor structure shown in FIGS. 8A to 8E corresponds to the portion of the structure of FIG. 1A which includes areas P1, P2 and P3. Thus, many of the reference numbers employed in FIGS. 8A to 8E directly correspond to like reference numbers and structure in FIG. 1A. In accordance with FIG. 8A, a silicon chip is the starting point. On the surface which is decisive for the further manufacturing steps there is preferably an N/N+ layer sequence, e.g., epitaxy. However, a P- conductive semiconductor material with selective, N+ buried regions may be employed. Semiconductor body 1 is covered, in a known manner, with an isolation layer 2, e.g., a silicon dioxide layer in the order of 5000 Å in thickness.

Figure 9:
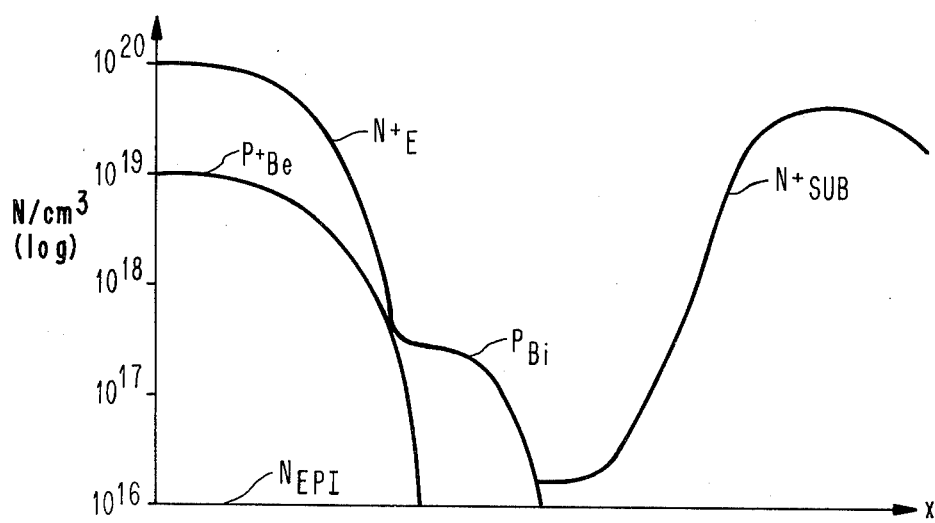
FIG. 9 is the representation of a doping profile for the output transistor, or transistors, of semiconductor structural embodiments in accordance with the invention.

Referring to the structure shown in FIG. 8B, a photolithographic process, known per se, has been employed. In this known photolithographic process, the (only) dimension-determining mask required has been employed. In all the areas or regions, where P-conductive areas are required, i.e. injectors, secondary injectors, and NPN transistors (or for possible isolation areas, respectively) the corresponding openings have been etched into isolation layer 2. There follows a P-doping step, e.g., a boron diffusion with a profile as shown in FIG. 9 and as explained hereinafter. Thus, the areas marked P1, P2, and P3 are generated as depicted in FIG. 8C. In the openings of isolation layer 2 through which these doped areas have been inserted the thinner isolation layer visible in FIG. 8C is subsequently formed, e.g., by means of a subsequent reoxidation with an oxide thickness in the order of, 1000 Å. In this manner, the entire surface of the semiconductor body is again covered with an isolation layer. By known means including a rough mask (so-called blockout mask), the thin oxide layer is removed only over the P3 doped area. The rough mask whose dimensions are relatively uncritical is shown in FIG. 8D and labelled 8. As stated above, the thin oxide layer is removed only over the P3 doped area as a prerequisite to providing the required NPN output transistor. The earlier recited known means employing the rough mask is preferably a known photolithographic process with a subsequent etching process to remove the thin oxide layer. It is clearly evident from FIG. 8D that the adjustment of rough mask 8 with its opening 9 is not critical because lateral displacements of the mask as well as possible lack of measurement precision of opening 9 can be tolerated to an extent that is quite out of the ordinary for that type of masking step. Through oxide opened window 10, FIG. 8D, the N1-doped area (N1) is provided in a known manner. The diffusion step is preferably not followed by a reoxidation, so that within the area of open window 10 the surface of the semiconductor body remains uncovered as shown in FIG. 8D.

By means of a brief subsequent dip etching (so-called dip open) without masking, the thin oxide layer in the remaining mask openings is removed. The dip etch time is precisely such a period of time that all the P-regions except P3, are again exposed. Thus, the P-regions with the exception of region P3 and including the N1 region are exposed. The structure of FIG. 8E is thus obtained. The subsequent process steps which are well known in the art and "per se" are not decisive within the scope of this invention. The subsequent process steps in a known manner include the application of metal, or metal compounds, by means of standard processes, and if necessary, in several layers. The subsequent process steps may also include the provision of the external contacts.

Instead of the reoxidation step discussed in connection with FIG. 8C it is also possible to apply silicon nitride which responds to etchants that do not remove silicon dioxide. The diffusion sequence may also be reversed, i.e., first N+ and then P. This can be achieved when in a first step silicon nitride is applied on a thinner silicon dioxide of approximately 1000 Å. There, the windows or openings are marked and the oxide is first opened through a rough mask in the N+ region only. A dip-open etching step then opens, after the N+-diffusion all windows, for the P-doping areas.

FIG. 9 shows an example for the vertical doping profile through such an NPN output transistor. This vertical profile does not have to differ from that of usual monolithic NPN transistors. However, it is equally possible to use more modern profiles that can be produced by means of ion implantation, where the doping of the intrinsic base of the transistor is defined by a deep implantation. The extrinsic base areas, i.e. also the P-type injectors, can be produced by means of diffusion or a second, more shallow implantation. The term intrinsic base refers in the present discussion to the actual base area which is provided in accordance with this invention without external contact. The structures of the present invention can e.g., be considered NPN transistors where spaced from the intrinsic base area a doping area showing the same conductivity type is provided which has an external contact via which the current flow through the NPN transistor can be controlled. This preceding or separate base contact area is called "extrinsic" base in the present context.

FIG. 9 shows in logarithmic scale an approximate representation of the doping density N/cm$^3$ as a function of depth x. $N_E{}^+$ is the doping curve of the "emitter" diffusion. As far as inverse transistor structures are used, it is known that these generate the collector areas in such injection logic concepts. $P_{Be}{}^+$ and $P_{Bi}$ respectively designate the P-doping density of the extrinsic and the intrinsic base areas. In the present discussion, extrinsic base areas are the base contact areas (secondary injectors), or even the primary injectors. The remaining doping data for the epitaxial layer ($N_{EPI}$) or the substrate ($N_{SUB}{}^+$) are self-evident.

It is not necessary to provide for the injectors also the intrinsic base doping. After the forming of the extrinsic base (for injectors and NPN transistor) a rough masking step can be applied via which the injectors are distinguished from the NPN transistor. Subsequently, intrinsic base and N+emitter (collector) are successively implanted in the NPN transistor.

It is also to be appreciated that as a variation of the conditions selected for the embodiments, the respective complementary conductivity types, opposite logic potential associations, different substrate materials and isolation means, even isolating substrates instead of semiconductors can be used without departing from the scope of the present invention. Instead of inversely operated structures normally operated transistors can be employed to the same advantage with respect to the applicability of the process described. Instead of a diffusion an implantation process or a combination of both these processes can be applied, as mentioned above. As far as reference is made to standard photolithographic processes these include also electron beam or even X-ray processes which promise high changes of success for very high integration densities.

While the invention has been particularly shown and described with reference to preferred embodiments thereof, it will be understood by those skilled in the art that various changes in form and detail may be made therein without departing from the spirit and scope of the invention.

What is claimed is:

1. A logical binary circuit for providing first and second electrically decoupled binary outputs $\overline{X}$ in response to the binary input X, said logical binary circuit comprising:
   first, second and third transistors of a first conductivity type, fourth and fifth transistors of a second conductivity type, each of said first through fifth transistors having an emitter, base and collector;
   a current source connected to said emitter of said first transistor;
   first connection means connecting in common said bases of said first, second and third transistors and said emitters of said fourth and fifth transistors;
   second connection means connecting said first connection means to a source of reference potential;
   third connection means connecting said collector of said second transistor to said base of said fourth transistor;
   fourth connection means connecting said collector of said third transistor to said base of said fifth transistor;
   fifth connection means connecting said collector of said first transistor to said emitter of said second transistor and said emitter of said third transistor;
   input means connected to said fifth connection means, said input means receiving the binary input X;
   first output means connected to said collector of said fourth transistor;
   second output means connected to said collector of said fifth transistor, said first and second output means each providing electrically decoupled binary outputs $\overline{X}$ in response to the binary input X;
   characterized in that said logical binary circuit is an integrated circuit fabricated within a monolithic semiconductor body having discrete regions of first and second conductivity type, wherein:

a first region of said first conductivity type provides said emitter of said first transistor;

a second region of said first conductivity type provides said collector of said first transistor, said emitter of said second transistor and said emitter of said third transistor;

a third region of said first conductivity type provides said collector of said second transistor and said base of said fourth transistor;

a fourth region of said first conductivity type provides said collector of said third transistor and said base of said fifth transistor;

a fifth region of said second conductivity type provides said bases of said first, second and third transistors and said emitters of said fourth and fifth transistors;

a sixth region of said second conductivity type provides said collector of said fourth transistor; and a seventh region of said second conductivity type provides said collector of said fifth transistor.

2. A logical binary circuit as recited in claim 1 wherein said sixth region of said second conductivity type is contained as a pocket within said third region of said first conductivity type;

and said seventh region of said second conductivity type is contained as a pocket within said fourth region of said first conductivity type.

3. A logical binary circuit as recited in claim 2 wherein said first conductivity type semiconductor material is P-type material and said second conductivity type semiconductor material is N-type material.

4. A logical binary circuit for providing the logical binary outputs $\overline{C}$, $\overline{A+C}$ and $\overline{A+B}$ in response to binary inputs A, B and C, said logical binary circuit comprising:

first, second, third, fourth, fifth, sixth, seventh and eighth transistors of a first conductivity type, ninth, tenth, eleventh, twelfth and thirteenth transistors of a second conductivity type, each of said first through thirteenth transistors having an emitter, base and collector;

a current source connected in common to said emitters of said first, second and third transistor;

first connection means connecting in common said bases of said first through eighth transistors and said emitters of said ninth through thirteenth transistors;

second connection means connecting said first connection means to a source of reference potential;

third connection means connecting said collector of said fourth transistor to said base of said ninth transistor;

fourth connection means connecting said collector of said fifth transistor to said base of said tenth transistor;

fifth connection means connecting said collector of said sixth transistor to said base of said eleventh transistor;

sixth connection means connecting said collector of said seventh transistor to said base of said twelfth transistor;

seventh connection means connecting said collector of said eighth transistor to said base of said thirteenth transistor;

eighth connection means connecting said collector of said first transistor to said emitters of said fourth and fifth transistors;

first input means connected to said eighth connection means, said first input means receiving the binary input C;

ninth connection means connecting said collector of said second transistor to said emitters of said sixth and seventh transistors;

second input means connected to said ninth connection means, said second input means receiving the binary input A;

tenth connection means connecting said collector of said third transistor to said emitter of said eighth transistor;

third input means connected to said tenth connection means, said third input means receiving the binary input B;

first output means connected to said collector of said ninth transistor, said first output means manifesting the binary output $\overline{C}$ in response to the binary input C;

second output means connected to said collectors of said tenth and eleventh transistors, said second output means manifesting the binary output $\overline{A+C}$ in response to the binary inputs A and C;

third output means connected to said collectors of said twelfth and thirteenth transistors, said third output means manifesting the binary output $\overline{A+B}$ in response to the binary inputs A and B;

characterized in that said logical binary circuit is an integrated circuit fabricated within a monolithic semiconductor body having discrete regions of first and second conductivity types, wherein:

a first region of said first conductivity type provides said emitters of said first, second and third transistors;

a second region of said first conductivity type provides said collector of said first transistor and said emitters of said fourth and fifth transistors;

a third region of said first conductivity type provides said collector of said second transistor and said emitters of said sixth and seventh transistors;

a fourth region of said first conductivity type provides said collector of said third transistor and said emitter of said eighth transistor;

a fifth region of said first conductivity type provides said collector of said fourth transistor and said base of said ninth transistor;

a sixth region of said first conductivity type provides said collector of said fifth transistor and said base of said tenth transistor;

a seventh region of said first conductivity type provides said collector of said sixth transistor and said base of said eleventh transistor;

an eighth region of said first conductivity type provides said collector of said seventh transistor and said base of said twelfth transistor;

a ninth region of said first conductivity type provides said collector of said eighth transistor and said base of said thirteenth transistor;

a tenth region of said second conductivity type provides the bases of said first through eighth transistors and said emitters of said ninth through thirteenth transistors;

an eleventh region of said second conductivity type provides said collector of said ninth transistor;

a twelfth region of said second conductivity type provides said collector of said tenth transistor;

a thirteenth region of said second conductivity type provides said collector of said eleventh transistor;

a fourteenth region of said second conductivity type provides said collector of said twelfth transistor; and a fifteenth region of said second conductivity type provides said collector of said thirteenth transistor.

5. A logical binary circuit as recited in claim 4, wherein:

said eleventh region of said second conductivity type is contained as a pocket within said fifth region of said first conductivity type;

said twelfth region of said second conductivity type is contained as a pocket within said sixth region of said first conductivity type;

said thirteenth region of said second conductivity type is contained as a pocket within said seventh region of said first conductivity type;

said fourteenth region of said second conductivity type is contained as a pocket within said eighth region of said first conductivity type; and said fifteenth region of said second conductivity type is contained as a pocket within said ninth region of said first conductivity type.

6. A logical binary circuit as recited in claim 4 wherein said first conductivity type semiconductor material is P-type material and said second conductivity type semiconductor material is N-type material.

7. An integrated circuit for providing logic functions, comprising:

a semiconductor body portion of one conductivity type having a major surface, a plurality of regions of opposite conductivity type formed in said body portion at said major surface, said plurality of regions including an injector region, at least one output base region, and at least one control collector region, said at least one control collector region being so disposed between said injector region and said output base region as to intercept minority carriers in said body portion passing from said injector region to said output base region, a single output collector region of said one conductivity type formed at said major surface within said output base region, said output base region forming an output transistor base-emitter junction with said body portion, said output collector region forming an output transistor base-collector junction with said output base region, the distance in any direction along said major surface between said output base-collector junction and said output base-emitter junction being substantially no greater than the maximum distance from said major surface to said output base-emitter junction, power supply terminals connected to said body portion and said injector region, an input terminal connected to said control collector region, and, an output terminal connected to said output collector region.

8. A logical binary circuit for providing the logical binary output $\overline{A+B}$ in response to binary inputs A and B, said logical binary circuit comprising:

first, second, third and fourth transistors of a first conductivity type, a fifth transistor of a second conductivity type, each said first through fifth transistors having an emitter, base, and collector;

a current source connected in common to said emitters of said first and fourth transistors;

first connection means connecting in common said bases of said first through fourth transistors and said emitter of said fifth transistor;

second connection means connecting said first connection means to a source of reference potential;

third connection means connecting said collector of said second transistor, said collector of said third transistor and said base of said fifth transistor;

fourth connection means connecting said collector of said first transistor to said emitter of said second transistor;

first input means connected to said fourth connection means, said first input means receiving the binary input A;

fifth connection means connecting said collector of said fourth transistor to said emitter of said third transistor;

second input means connected to said fifth connection means, said second input means receiving the binary input B;

output means connected to said collector of said fifth transistor, said output means manifesting the binary output $\overline{A+B}$ in response to binary inputs A and B;

characterized in that said logical binary circuit is an integrated circuit fabricated within a monolithic semiconductor body having discrete regions of first and second conductivity types, wherein:

a first region of said first conductivity type provides said emitter of said first transistor;

a second region of said first conductivity type provides said emitter of said fourth transistor;

a third region of said first conductivity type provides said collector of said first transistor and said emitter of said second transistor;

a fourth region of said first conductivity type provides said collector of said fourth transistor and said emitter of said third transistor;

a fifth region of said first conductivity type provides said collector of said second transistor, said base of said fifth transistor, and said collector of said third transistor;

a sixth region of said second conductivity type provides said bases of said first through fourth transistors and said emitter of said fifth transistor; and a seventh region of said second conductivity type provides said collector of said fifth transistor;

said sixth region being a semiconductor body portion having a major surface;

said first through fifth regions being formed in said body portion at said major surface;

said fifth region forming with said sixth region a base-emitter junction of said fifth transistor;

said seventh region forming with said fifth region a base-collector junction of said fifth transistor;

the distance in any direction along said major surface between said fifth transistor base-collector junction and said fifth transistor base-emitter junction being substantially no greater than the maximum distance from said major surface to said fifth transistor base-emitter junction.

9. A logic binary circuit as recited in claim 8 wherein said first conductivity type semiconductor material is P-type material and said second conductivity type semiconductor material is N-type material.

* * * * *